(12) United States Patent
Feng et al.

(10) Patent No.: US 11,054,128 B2
(45) Date of Patent: Jul. 6, 2021

(54) SEALING STRUCTURE OF A LIGHT STRIP

(71) Applicant: Guangdong Hhhled Optoelectronic Technology Co., Ltd., Jiangmen (CN)

(72) Inventors: Ting Feng, Jiangmen (CN); Mingbin Yu, Jiangmen (CN); Hua Yang, Jiangmen (CN)

(73) Assignee: Guangdong Hhhied Optoelectronic Technology Co., Ltd., Jiangmen (CN)

( * ) Notice: Subject to any disclaimer, the term of this patent is extended or adjusted under 35 U.S.C. 154(b) by 0 days.

(21) Appl. No.: 16/744,684

(22) Filed: Jan. 16, 2020

(65) Prior Publication Data

US 2021/0164643 A1 Jun. 3, 2021

(30) Foreign Application Priority Data

Nov. 29, 2019 (CN) .......................... 201911202751.0

(51) Int. Cl.
*F21V 31/00* (2006.01)
*F21Y 115/10* (2016.01)

(52) U.S. Cl.
CPC .......... *F21V 31/005* (2013.01); *F21Y 2115/10* (2016.08)

(58) Field of Classification Search
CPC .... F21V 31/005; F21Y 2115/10; H01L 23/28; H01L 23/3107; H01L 23/3185; H01L 33/58; H01L 23/3142; H01L 33/52; H05K 3/284; F21K 9/90; B60Q 1/2696
See application file for complete search history.

(56) References Cited

U.S. PATENT DOCUMENTS

| | | | | |
|---|---|---|---|---|
| 7,224,000 | B2 * | 5/2007 | Aanegola | H01L 33/52 257/98 |
| 7,800,124 | B2 * | 9/2010 | Urano | H01L 33/483 257/98 |
| 8,956,922 | B2 * | 2/2015 | Peil | H01L 33/58 438/127 |
| 9,541,239 | B2 * | 1/2017 | Scordino | F21V 31/005 |
| 2006/0255352 | A1 * | 11/2006 | Lin | F21K 9/00 257/98 |
| 2012/0063139 | A1 * | 3/2012 | Benkart | H05K 3/284 362/249.02 |
| 2014/0104838 | A1 * | 4/2014 | Reiss | F21S 4/20 362/249.06 |
| 2020/0098732 | A1 * | 3/2020 | Meir | H01L 33/502 |
| 2020/0182417 | A1 * | 6/2020 | Kager | B60Q 3/30 |

\* cited by examiner

*Primary Examiner* — Peggy A Neils
(74) *Attorney, Agent, or Firm* — Carter, DeLuca & Farrell LLP; George Likourezos

(57) ABSTRACT

A sealing structure of light strip includes a light strip glue dispensing plate covered with pouring glue for packaging, and two glue blocking structures respectively arranged on two sides of the pouring glue in an extending direction on the light strip glue dispensing plate. The edge overflow of the pouring glue during glue dispensing can be prevented.

9 Claims, 2 Drawing Sheets

SEALING STRUCTURE OF A LIGHT STRIP

FIELD

The present disclosure relates to a sealing structure of a light strip, belonging to a field of packaged electronic equipment.

BACKGROUND

At present, in the field of electronic equipment, packaging of a PCB mainboard is an important process, through packaging, a function of the mainboard can be stabilized and a performance can be improved, and packaging for a LED circuit board or a substrate is commonly used. Glue sealing is an important technological process in a back-end process of the packaging, and a luminous spectral property of a light source and protection of a chip (bonding wire) and fluorescent glue can be realized by step-by-step glue dispensing. With reference to FIG. 1 and FIG. 2, when the existing glue dispensing is applied to a substrate, dispensed glue can easily overflow or become irregular on an edge due to a certain fluidity, thus causing an inconsistent width of the glue on the substrate, which not only is unsightly in appearance, but also affects a luminous performance Especially, uneven chromaticity and inconsistent color temperature control on all parts of the substrate can be caused.

SUMMARY

In order to solve the problems above, the present disclosure is intended to provide a sealing structure of a light strip, which can prevent glue overflow on an edge during gluing, so that a consistent color temperature can be controlled and a beautiful and simple appearance can be kept.

In order to make up for the defects of the prior art, the technical solutions of the present disclosure are as follows in some embodiments.

A sealing structure of a light strip includes: a light strip glue dispensing plate covered with pouring glue for packaging the light strip glue dispensing plate; and two glue blocking structures respectively arranged on two sides of the pouring glue in an extending direction on the light strip glue dispensing plate.

In one or more technical solutions in the embodiments of the present disclosure there are at least the following beneficial effects that: dispensing the pouring glue on the light strip glue dispensing plate is used to realize packaging of the light strip glue dispensing plate. In particular, the glue blocking structures are respectively arranged on two sides of the pouring glue in a glue dispensing direction. When the pouring glue is dispensed, the glue blocking structure can limit a glue dispensing position, thus preventing glue overflow on an edge during glue dispensing and keeping an overall appearance of a glue dispensing structure simple. Meanwhile, since the glue dispensing structure is regular and complete, that is, distribution of the pouring glue on the light strip glue dispensing plate is relatively more even, a color temperature can be kept consistent on all parts of the light strip glue dispensing plate.

Further, the two glue blocking structures are both arranged to be concave or convex to one side of an upper surface of the light strip glue dispensing plate.

Further, each of the glue blocking structures and the light strip glue dispensing plate are arranged in a laminated manner.

Further, each of the glue blocking structures includes a plurality of glue blocking edges arranged in parallel.

Further, the light strip glue dispensing plate is in form of a strip shape.

Further, the light strip glue dispensing plate is a flexible PCB board or an aluminum substrate hard strip.

Further, the pouring glue includes a powder glue layer and outer sealing glue, the powder glue layer is laid on the light strip glue dispensing plate, and the outer sealing glue is laid on the powder glue layer.

The additional aspects and advantages of the present disclosure will be partially given in the following description, and some will become apparent from the following description, or will be understood through the practice of the present disclosure.

BRIEF DESCRIPTION OF THE DRAWINGS

The preferred embodiments of the present disclosure are given hereinafter with reference to the drawings to describe the implemented solutions of the present disclosure in detail.

DETAILED DESCRIPTION

Figure 1:
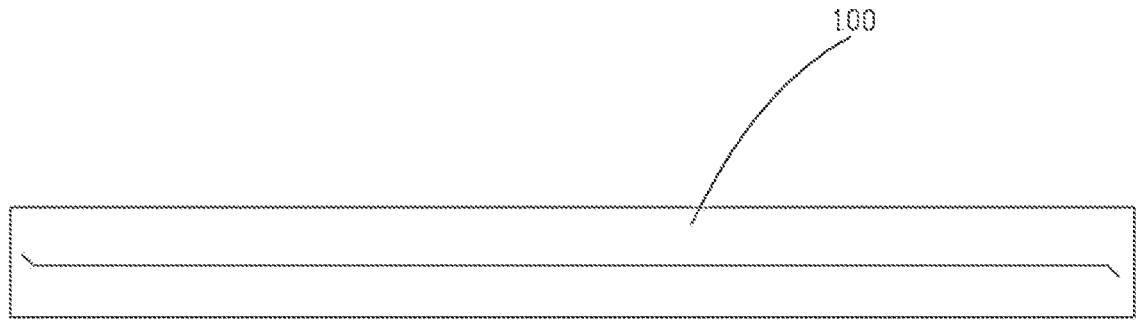
FIG. 1 is a top view of a glue dispensing structure in the prior art.
Figure 2:
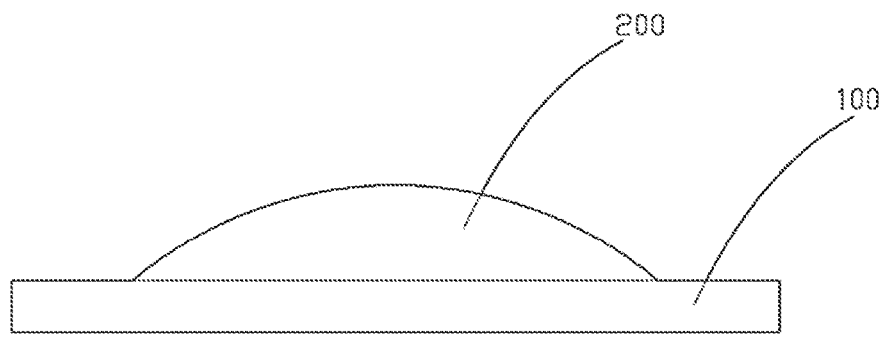
FIG. 2 is a side view of the glue dispensing structure in the prior art.

This section will describe the specific embodiments of the present disclosure in detail, the preferred embodiments of the present disclosure are shown in the drawings, and the drawings are used to supplement the description in the written part of the description with graphics, so that people can intuitively and vividly understand each technical feature and overall technical solution of the present disclosure, but they cannot be understood as limiting the protection scope of the present disclosure.

In the description of the present disclosure, it should be understood that if the orientation or positional relationship indicated by the terms such as upper, lower, front, back, left, right and the like is based on the orientation or positional relationship shown in the drawings, it is only for the convenience of describing the present disclosure and simplifying the description, and it is not to indicate or imply that the indicated device or element must have a specific orientation, be constructed and operate in a specific orientation. Therefore, the terms should not be construed as limiting the disclosure In the description of the present disclosure, the meaning of a plurality of is one or more than one, and the meaning of multiple is two or more than two.

Figure 5:
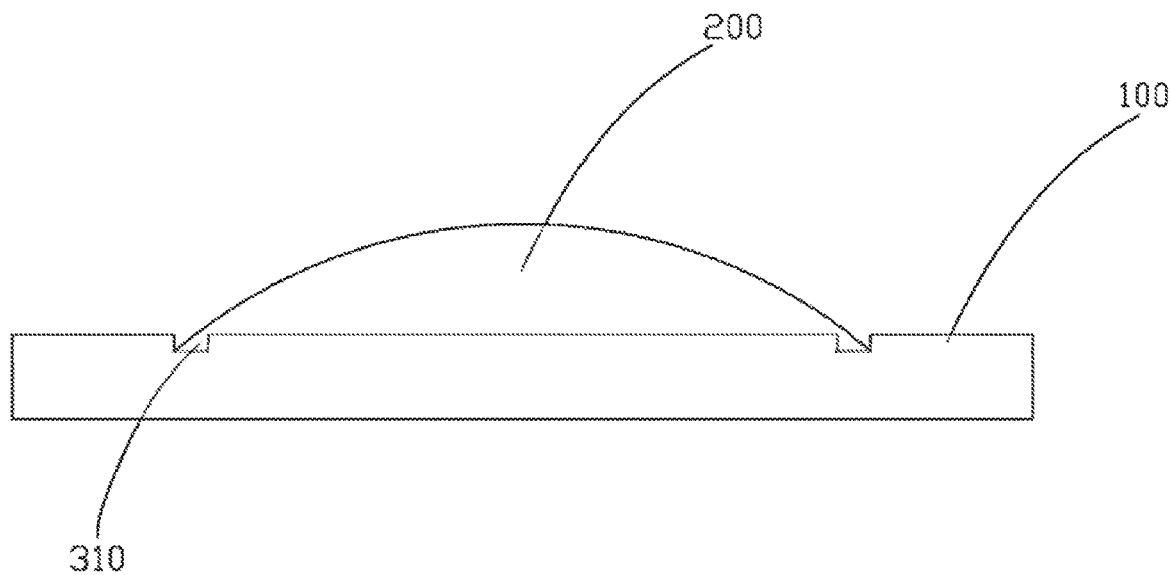
FIG. 5 is a side view of the sealing structure of a light strip under the "concave" glue blocking structure according to the embodiment of the present disclosure.
Figure 6:
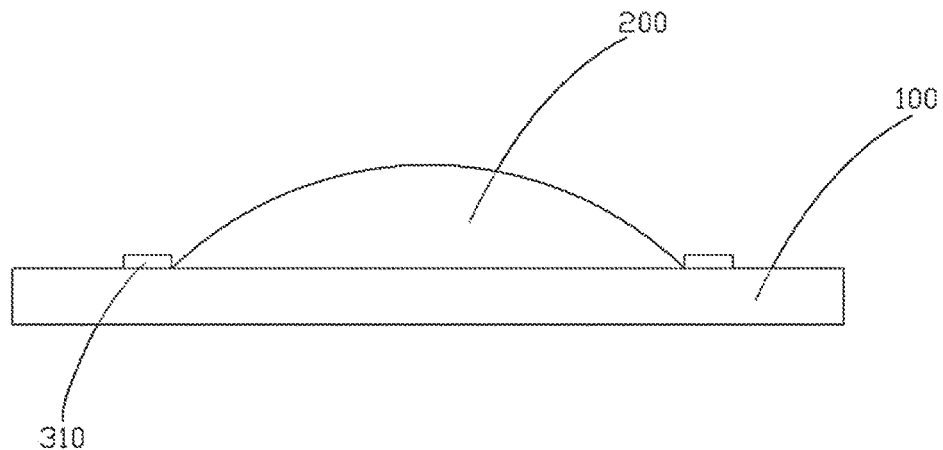
FIG. 6 is a side view of the sealing structure of a light strip under the "convex" glue blocking structure according to the embodiment of the present disclosure.

As used in the disclosure, the term "convex" refers to structures protruding or raised, or are "convex," above an upper surface of the light strip glue dispensing plate, as illustrated in FIG. 6. The term concave refers to structures, such as channels or grooves, that are cut into or are "concave" to an upper surface of the light strip glue dispensing plate, as illustrated in FIG. 5.

In the description of the present disclosure, the terms arrangement, installation, connection and the like should be understood in broad sense unless otherwise specified and defined. The specific meaning of the above terms in the present disclosure can be reasonably determined according to specific contents of the technical solutions by those skilled in the art.

The embodiments of the present disclosure are further described hereinafter with reference to the drawings.

A sealing structure of a light strip includes:

a light strip glue dispensing plate 100 covered with pouring glue 200 for packaging the light strip glue dispensing plate 100; and two glue blocking structures 300 respectively arranged on two sides of the pouring glue 200 in an extending direction on the light strip glue dispensing plate 100, so that edge overflow of the pouring glue 200 during glue dispensing can be prevented.

In the embodiment, with reference to FIG. 5, dispensing the pouring glue 200 on the light strip glue dispensing plate 100 is used to realize packaging of the light strip glue dispensing plate 100. In particular, the glue blocking structures 300 are respectively arranged on two sides of the pouring glue 200 in a glue dispensing direction. When the pouring glue 200 is dispensed, the glue blocking structure 300 can limit a glue dispensing position, thus preventing glue overflow on an edge during glue dispensing and keeping an overall appearance of a glue dispensing structure simple. Meanwhile, since the glue dispensing structure is regular and complete, that is, distribution of the pouring glue 200 on the light strip glue dispensing plate 100, blue light emitted by a chip and compound light emitted by dispensed powder glue are relatively more even, a color temperature can be kept consistent on all parts of the light strip glue dispensing plate 100.

Figure 3:
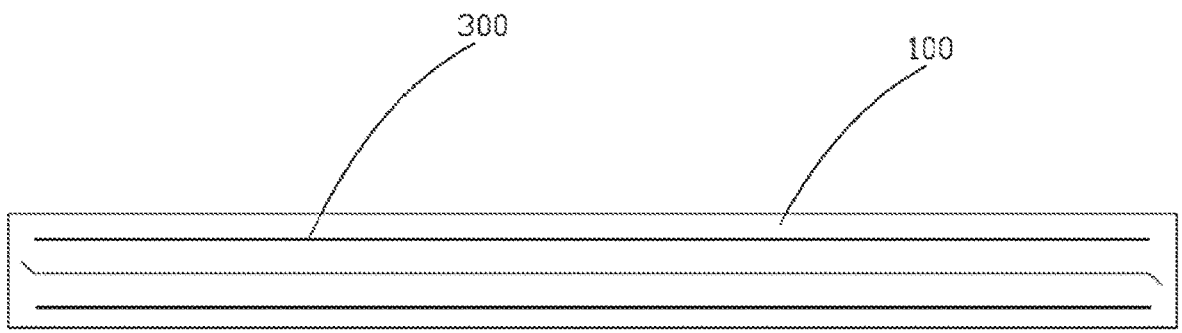
FIG. 3 is a top view of a sealing structure of a light strip under a "concave" glue blocking structure according to the embodiment of the present disclosure.

In an embodiment, with reference to FIG. 3, one glue blocking edge 310 or a plurality of glue blocking edges 310 arranged in parallel can be adopted in each the glue blocking structures 300, and a number can be determined according to a thickness of the glue blocking edge 310 and related costs. When the plurality of glue blocking edges 310 are arranged, advantages of arranging the glue blocking edges 310 in parallel lie in that: an overall appearance of the glue blocking structure 300 is kept, so that the glue blocking structure 300 is not too messy, and more importantly, glue edge residues may be accommodated between the glue blocking edges 310, so that a limiting effect of each glue blocking edge 310 is kept the same, and glue dispensing disorder is prevented.

In an embodiment, the light strip glue dispensing plate 100 is a flexible PCB board or an aluminum substrate hard strip, that is, the glue dispensing can be performed on the flexible circuit board or the aluminum substrate hard strip, both of which are widely applied in a field of current LED light such as a light strip and the like, and the field is a widely applied field. Certainly, the light strip glue dispensing plate 100 can also be made of a similar main board as long as the glue dispensing is needed, which is applied to glue dispensing equipment.

Figure 4:
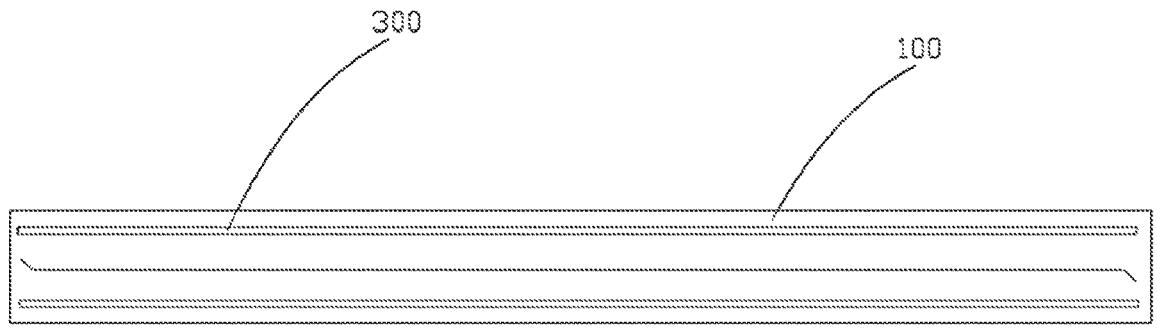
FIG. 4 is a top view of a sealing structure of a light strip under a "convex" glue blocking structure according to the embodiment of the present disclosure.

In a further embodiment, with reference to FIG. 4, the light strip glue dispensing plate 100 is in form of a strip shape, which complies with current production requirements and is relatively simpler and more convenient to manufacture, such as manufacturing a whole aluminum substrate or an extended light strip.

In a further embodiment, each of the glue blocking structures 300 and the light strip glue dispensing plate 100 are arranged in a laminated manner, that is, a layer property exists between each of the glue blocking structures 300 and the light strip glue dispensing plate 100. By virtue of a difference between layers, the glue dispensing can be realized in a layered manner, and the pouring glue 200 is not dispensed at one time, so that the technical problem of overflow easily caused by excessive pouring glue 200 dispensed at one time can be avoided.

In a further embodiment, the two glue blocking structures 300 are both arranged to be concave or convex to two sides of an upper surface of the light strip glue dispensing plate 100. With reference to FIG. 5, if the glue blocking structure 300 is arranged to be concave to one side of the upper surface of the light strip glue dispensing plate 100, that is, the glue blocking structure 300 is "concave", then a concave laminated structure is formed between the glue blocking structure 300 and the light strip glue dispensing plate 100. When the glue dispensing is performed on the light strip glue dispensing plate 100, edges on two sides of the pouring glue 200 are accommodated in the concave space, and the pouring glue 200 cannot diffuse and overflow to a region outside the space, thus achieving a good glue overflow prevention effect. Similarly, with reference to FIG. 6, if the blocking structure 300 is "convex" to one side of the upper surface of the light strip glue dispensing plate 100, that is, the blocking structure 300 is "convex", then the edges on the two sides of the pouring glue 200 can also be blocked and limited, and the same technical effect can be achieved.

Preferably, in the embodiment, the pouring glue 200 includes a powder glue layer and outer sealing glue, the powder glue layer is laid on the light strip glue dispensing plate 100, and the outer sealing glue is laid on the powder glue layer. The powder glue layer is made of silica gel, epoxy resin and the like mixed with fluorescent powder, and the outer sealing layer is made of a single material with a high light transmittance and a high density, such as silica gel. The silica gel is widely used, especially room temperature vulcanized silicone rubber or organic silica gel, which can be used for pouring and sealing of electronic and electrical components, and can play roles of moisture prevention, dust prevention, corrosion prevention, shock prevention, sealing and theft prevention, and improve a service performance of the electronic and electrical components and stabilize parameters. Moreover, the silica gel is liquid before vulcanization, which is convenient to pour and use.

The foregoing embodiments and basic principles of the present disclosure are described in detail, but without limitation to the disclosure. Those skilled in the art should understand that there are various equivalent modifications and substitutions without departing from the principle of the present disclosure, which also fall within the scope of the present invention in the accompanying claims.

The invention claimed is:

1. A sealing structure of a light strip, comprising:
a light strip glue dispensing plate covered with pouring glue for packaging the light strip glue dispensing plate; and
two glue blocking structures configured to limit a glue dispensing position, respectively arranged on two sides of the pouring glue in an extending direction on the light strip glue dispensing plate, wherein the two glue blocking structures are both arranged to be concave to one side of an upper surface of the light strip glue dispensing plate, and each of the glue blocking structures comprises a plurality of straight glue blocking edges arranged in parallel, and are configured to prevent glue overflow over a top surface of the light strip glue dispensing plate during glue dispensing.

2. The sealing structure of a light strip according to claim 1, wherein each glue blocking structure and the light strip glue dispensing plate are arranged in a laminated manner.

3. The sealing structure of a light strip according to claim 1, wherein the light strip glue dispensing plate is in form of a strip shape.

4. The sealing structure of a light strip according to claim 1, wherein the light strip glue dispensing plate is a flexible PCB board or an aluminum substrate hard strip.

5. The sealing structure of a light strip according to claim 2, wherein the light strip glue dispensing plate is a flexible PCB board or an aluminum substrate hard strip.

6. The sealing structure of a light strip according to claim 3, wherein the light strip glue dispensing plate is a flexible PCB board or an aluminum substrate hard strip.

7. The sealing structure of a light strip according to claim 1, wherein the pouring glue comprises a powder glue layer and outer sealing glue, and wherein the powder glue layer is laid on the light strip glue dispensing plate, and the outer sealing glue is laid on the powder glue layer.

8. The sealing structure of a light strip according to claim 1, wherein the two glue blocking structures are further configured to maintain a glue dispensed on the light strip in a regular and complete distribution.

9. The sealing structure of a light strip according to claim 8, wherein, when glue is dispensed on the light strip between the two glue blocking structures, light emitted by a chip disposed on the light strip and compound light emitted by the glue are emitted evenly and at a consistent color temperature.

* * * * *

UNITED STATES PATENT AND TRADEMARK OFFICE
CERTIFICATE OF CORRECTION

PATENT NO.        : 11,054,128 B2
APPLICATION NO.   : 16/744684
DATED             : July 6, 2021
INVENTOR(S)       : Ting Feng, Mingbin Yu and Hua Yang Page 1 of 1

It is certified that error appears in the above-identified patent and that said Letters Patent is hereby corrected as shown below:

On the Title Page

Item (73) should read:
--Guangdong Hhhled Optoelectronic Technology Co., Ltd., Jiangmen (CN)--

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*